United States Patent
Barringer et al.

(10) Patent No.: US 6,806,943 B2
(45) Date of Patent: Oct. 19, 2004

(54) MASK CLAMPING DEVICE

(75) Inventors: Wayne A. Barringer, Wallkill, NY (US); David J. Pinckney, Newton, CT (US); Joseph E. Santilli, Poughquag, NY (US); Maris A. Sturans, Galloway, NJ (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 10/217,360

(22) Filed: Aug. 9, 2002

(65) Prior Publication Data

US 2004/0027551 A1 Feb. 12, 2004

(51) Int. Cl.[7] .......................... G03B 27/62; G03B 27/58
(52) U.S. Cl. .......................................... 355/75; 355/72
(58) Field of Search .............................. 355/72–76, 53

(56) References Cited

U.S. PATENT DOCUMENTS

| | | | | |
|---|---|---|---|---|
| 4,711,438 A | * | 12/1987 | Guarino | 269/152 |
| 5,843,623 A | | 12/1998 | Pinckney | |
| 5,847,813 A | * | 12/1998 | Hirayanagi | 355/75 |
| 6,172,738 B1 | * | 1/2001 | Korenaga et al. | 355/53 |
| 6,499,158 B1 | * | 12/2002 | Easterling | 5/600 |
| 6,606,145 B2 | * | 8/2003 | Irie et al. | 355/72 |

* cited by examiner

Primary Examiner—Henry Hung Nguyen
(74) Attorney, Agent, or Firm—William P. Skladony; Jay H. Anderson

(57) ABSTRACT

A method and apparatus for clamping a semiconductor mask to a carrier device is taught. The apparatus is comprised of a base member to which is attached an elongated spring. Both the base and the spring have affixed to them a means for compressively contacting the mask surface when the mask is put in place. In the preferred embodiment, that contact means is made of sapphire shaped in the form of a dome. The clamp further includes an adjustment screw that can be used to adjust the height of the contact means affixed to the base member. In this manner, the surface of the mask can be adjusted so that it is planarized to the right orientation relative to an e-Beam or laser source that will be used to scribe a pattern on the mask. Finally, the clamp includes electrical contacts, and the materials out of which the clamp is made are deliberately selected, so that no electrical or magnetic forces can build up on the clamp or the wafer that might adversely affect the scribing process.

22 Claims, 7 Drawing Sheets

```
┌─────────────────────────┐
│   APPLY FORCE TO SPRING │──100
│   TO SEPERATE LOWER AND │
│        UPPER BALL       │
└─────────────────────────┘

┌─────────────────────────┐
│    PLACE MASK BETWEEN   │──102
│   UPPER AND LOWER BALLS │
└─────────────────────────┘

┌─────────────────────────┐
│    RELEASE SPRING TO    │──104
│  COMPRESS MASK BETWEEN  │
│   UPPER AND LOWER BALLS │
└─────────────────────────┘

┌─────────────────────────┐
│  MAKE ELECTRICAL CONTACT│──106
│         WITH MASK       │
└─────────────────────────┘

┌─────────────────────────┐
│   TEST IF MASK IS IN PLACE │──110
└─────────────────────────┘

┌─────────────────────────┐
│   ADJUST HEIGHT OF UPPER │──112
│    BALL TO PLANARIZE MASK│
└─────────────────────────┘
```

FIG. 6

MASK CLAMPING DEVICE

FIELD OF THE INVENTION

The present invention generally relates to an apparatus and method for clamping a semiconductor mask during the process by which a high resolution pattern is scribed on the mask.

BACKGROUND OF THE INVENTION

It is well known in the semiconductor wafer manufacturing art that so-called "masks" are used in connection with semiconductor wafer processing. In connection with such processing, a given wafer is subjected to many steps, during which masks are used to establish various patterns on the many layers of the wafer as it is progressively coated with the insulative and conductive materials, which eventually form the complex circuitry on the extremely tiny chips that are eventually diced out of the total wafer. Such masks are typically made of glass.

Before a given mask can be used for such wafer processing, the mask, itself, must be subjected to a process by which the high resolution patterns are scribed onto its surface, wherein the scribing is generally done with a laser or an electron beam (e-beam). In a typical mask scribing operation, the mask is first loaded onto a carrier device, and the carrier device containing the mask is then placed under the automated control of the laser or e-beam machine that performs the scribing process. During this process the carrier and the mask are subjected to the very rapid movements of the machine. One concern that results from this processing approach is that the rapid acceleration and deceleration of the carrier and the mask, during the mask scribing process, may cause the mask to shift its position on the carrier. As can easily be appreciated, the very precise alignment and positioning of the mask on the carrier is critical since its positioning will determine where the laser or e-beam will actually scribe the pattern. Hence, it is very important that the clamp be powerful enough to hold the mask firmly and fixedly in place during the entire scribing operation, which necessarily means that the mask cannot shift position relative to the carrier device as the two of them are rapidly moved about by the machine. On the other hand, the clamp cannot place an excessive force on the glass mask, since an excessive force could generate stress fields within the glass that might degrade the mask or the performance of the scribing process. Additionally, in order to make the clamp usable in the very small amount of space that is available in a laser scribing chamber, it is desirable for the clamp to be physically as small as possible, or to have a minimal "footprint". Thus, the clamping mechanism used to hold the mask in place during the scribing operation must have a compact size, and must serve the dual purposes of maintaining the mask in a fixed position relative to the carrier, and doing so in a manner that does not damage the mask.

In addition to physically securing the mask, the mask clamp must be able to hold the mask perfectly level (or "planarized") during the scribing process. With respect to modern scribing systems, such planarization must be done to extremely tight tolerances, typically at the sub-tenth micron level. Accordingly, the clamp must be able to allow for the adjustment of the height and angle of the surface of the mask, so that it can be made perfectly level to accommodate the precise scribing process. Yet another concern arises from the use of scribing tools, such as e-beam lithography tools, which may generate charges on the mask during the scribing process. As a result, the clamp must be able to conduct any such charges away from the mask to prevent electric field generation which may cause the mispositioning of the scribing beam. Care must also be taken to not generate magnetic fields introduced by magnetic or conductive materials which may produce eddy currents.

Moreover, for various reasons of convenience and manufacturing efficiency, it is desirable to have a clamp that is easy to load with the mask, both manually and through automation, and requires a minimal number of steps to operate. More particularly, certain known clamps are activated from underneath or by turning mechanisms from the side. Such approaches are not particularly easy to use, especially in connection with automated loading of a mask in the clamp.

Accordingly, what is needed is a clamping device which addresses the various concerns noted above.

SUMMARY OF THE INVENTION

In accordance with the preferred embodiment of the present invention, an apparatus and method for clamping a semiconductor mask to a carrier device is provided. The mask clamp includes a base, to which is attached a spring. Mounted on the spring is a ball that makes contact with the underside of the mask when it is mounted in the clamp. Directly and precisely opposed to the ball which makes contact with the underside of the mask, is a another ball mounted in the top portion of the clamp, and which involves contact with the top side of the mask. Accordingly, when the spring is depressed, there is sufficient space for the mask to be mounted in the clamp, but when the spring is released, the mask is fixedly pinched between the two balls. In addition, the top portion of the clamp is adjustable by means of a high resolution height adjustment screw. The adjustment screw allows for very precise adjustments to the height of the mask once it is in place in the clamp, and therefore can be used to planarize the top surface of the mask. Finally, in one alternate embodiment, the clamp includes grounding contacts, which make electrical contact with the mask when it is in position. In this manner, the clamp can be used to maintain the mask at a constant electrical potential, such as a ground potential, during the scribing of the pattern on the mask.

It is therefore an object of the present invention to provide an apparatus and method for clamping a semiconductor mask on a carrier for the overall purpose of scribing the mask with a high resolution pattern.

It is also an object of the invention to provide such an apparatus and method for keeping the mask in a fixed position relative to the carrier during the rapid movement that the mask and carrier are subjected to during the scribing process.

It is another object of the invention to provide such an apparatus that can precisely adjust the height and surface angle of the mask so that it can be planarized within extremely refined tolerances.

It is yet a further object of the invention to provide such an apparatus and method that meets the electrical and magnetic requirements and limitations for use in the scribing process.

It is still further an object of the invention to provide such an apparatus and method that has a small geometric profile, is powerful in spite of its small size, and is easy to use in connection with manual as well as automated loading of the mask.

BRIEF DESCRIPTION OF THE DRAWINGS

FIG. 2B is shown from a different orientation.

FIG. 6 is a flow diagram illustrating the manner in which the clamp of FIG. 2A can be used to hold a semiconductor mask in place.

DETAILED DESCRIPTION OF THE PREFERRED EMBODIMENT OF THE INVENTION

Figure 1:
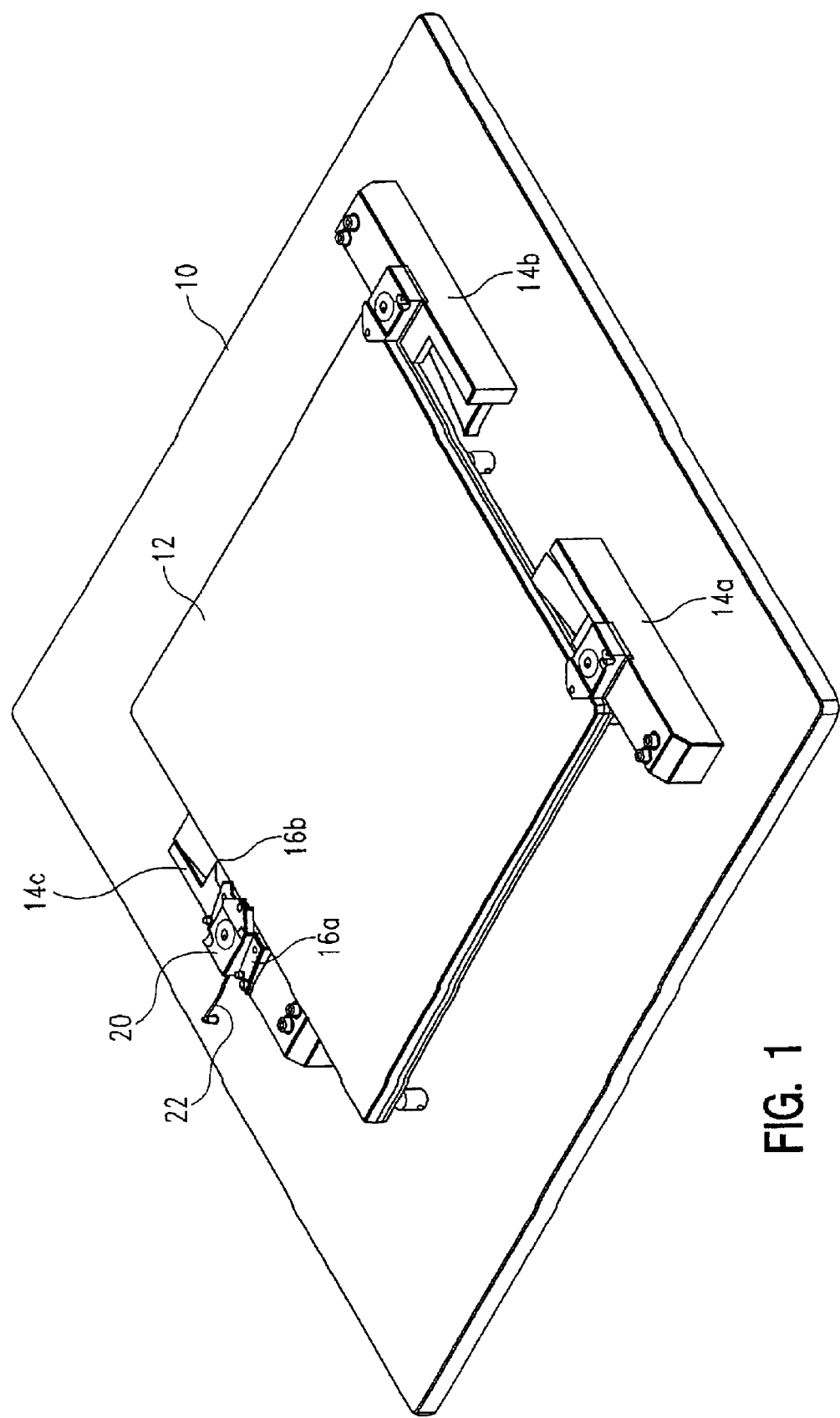
FIG. 1 is a top down, isometric view of a semiconductor mask on a carrier device, wherein the mask is held on the carrier device by means of three clamps which are designed in accordance with the preferred embodiment of the present invention.

The preferred embodiment of the invention is a clamp used to secure a semiconductor mask, while the mask is subjected to an automated laser or e-beam scribing process. The general environment in which such a clamp is used can be described in connection with FIG. 1. As seen in FIG. 1, a carrier 10 provides an overall base platform for the processing of mask 12. In the environment of the preferred embodiment, mask 12 is made out of a base layer of quartz with a layer of chrome, which is then coated with a photo resist. To the extent that mask 12 will be used in connection with the processing of semiconductor wafers, it will need to have a complex, and extremely high resolution pattern over a large area, up to 9"×9", scribed onto its surface, wherein such features may have sub-tenth micron dimensions. To do the scribing, mask 12 will be mounted on carrier 10, and then carrier 10 together with mask 12 will be loaded into a scribing machine (not shown), such as one manufactured by Applied Materials of Santa Clara, Calif., or an EL5 System manufactured by IBM Corporation of Armonk, N.Y. (For purposes of clarity, it should be noted that the specific preferred embodiment discussed herein and depicted in the associated drawings is specifically designed for the IBM EL5 System.) Such scribing machines or lithography systems will establish the pattern on the surface of mask 12. As can be seen from FIG. 1, mask 12 is actually mounted on carrier 10 by means of clamps 14a, 14b, and 14c, which are fixedly attached to carrier 10. Although three clamps are actually shown in FIG. 1, the exact number of clamps which may be used in a practical application will be chosen based on the specifics of that application.

Also, it should be noted, in referring to FIG. 1 that the two clamps 14a and 14b in the foreground of the illustration are the same as one another, but are slightly different from the single clamp 14c shown in the background and situated by itself. That slight difference relates to the fact that clamp 14c has two contacts 16a and 16b positioned on either side of brace 20. In FIG. 1, one of the contacts 16b is connected to wire 22, which in turn is connected to electrical circuitry (not shown). When mask 12 is loaded in clamp 14c contacts 16a and 16b will make electrical contact with mask 12 for the purpose of establishing a test signal for the purpose of establishing electrical ground for the mask. Further details on contacts 16a and 16b and their purpose shall be provided below; however, the main point to be understood, at this time, is that in one embodiment clamp 14 may have contacts 16a and 16b, while in another embodiment it may not.

Figure 2A:
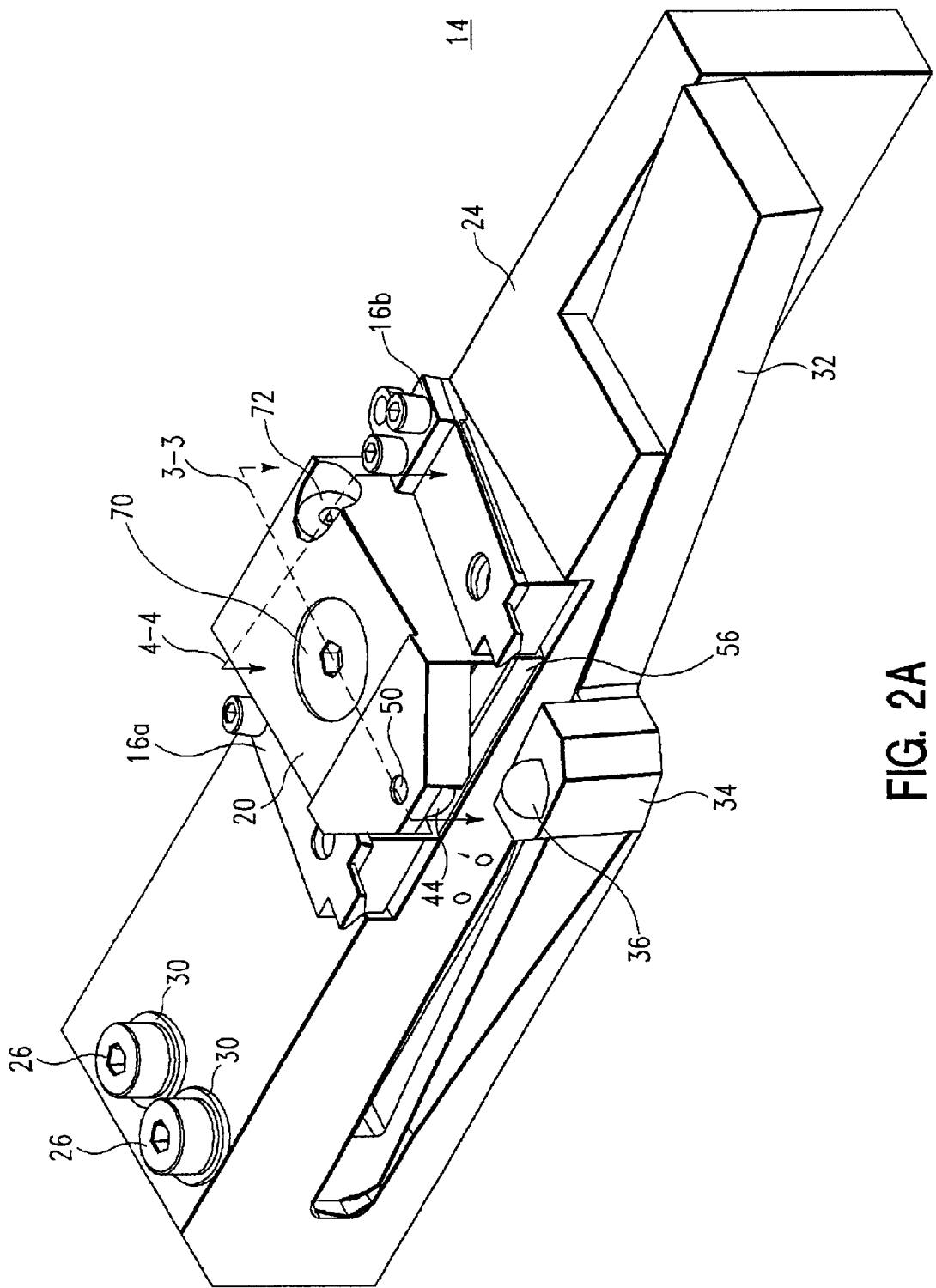
FIG. 2A is a top down, isometric view of one of the clamps shown in FIG. 1.
Figure 2B:
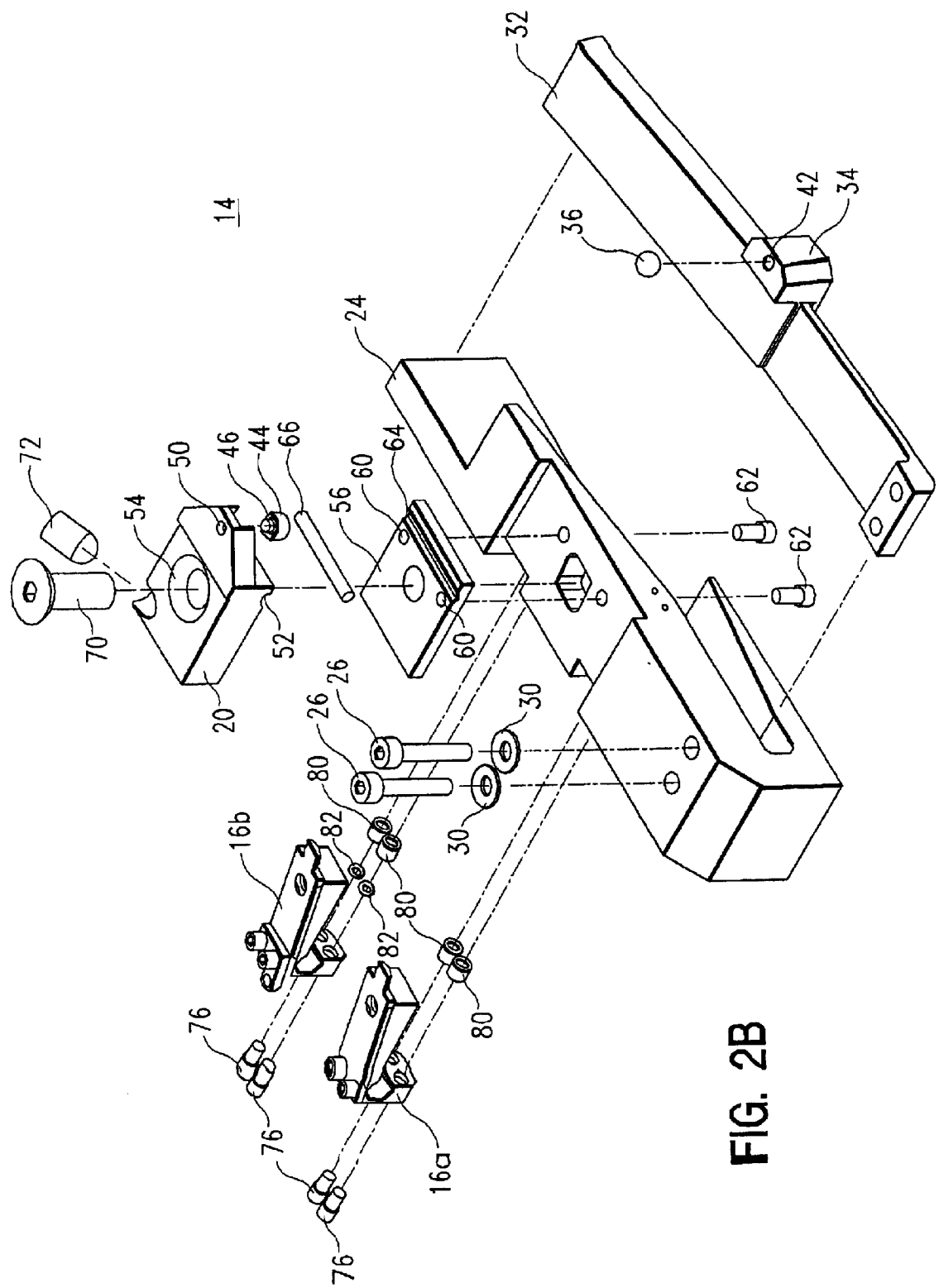
FIG. 2B is a top down, isometric, exploded view of the clamp shown in FIG. 2A, however

Having shown the general environment in which clamp 14 is used, it is useful to now turn to FIGS. 2A and 2B. FIG. 2A is an isometric view of clamp 14, while FIG. 2B is likewise an isometric view of clamp 14 (albeit shown from a different orientation), but FIG. 2B also provides an exploded view to shown a number of the details of clamp 14 that are obscured in FIG. 2A, which shows clamp 14 fully assembled. For purposes of the following discussion of the details of clamp 14 both FIGS. 2A and 2B should be viewed.

As seen, clamp 14 is made of a number of individual components, which when fully assembled is approximately 79 mm (long)×15 mm (wide)×20 mm (high). Relative to the other individual components, base 24 is a comparatively large, almost J-shaped component, which in the preferred embodiment is made of Macor coated with titanium nitride (TiN). Macor is beneficial in this application because it is easy to machine, and it provides very high strength. Additionally, Macor is non-conductive, having a high resistivity on the order of 170 microohm-cm, and it prevents eddy currents from being generated in clamp 14 during a scribing process, such as one using an e-Beam lithography system. TiN is, of course, conductive, however in this application the TiN coating on the Macor is so thin (1–5 microns), any eddy currents that are generated are of such a small time constant and small magnitude that they are not a problem. Additionally, the TiN coating allows any charges generated on the surface of clamp 14 by the lithography process to be drained off. This design of the preferred embodiment has the further advantages that it is able to support a 10 lb load (resulting from the spring, as discussed below) in a relatively small "footprint", and it ensures that base 24 does not twist, deflect, or deform under the loading conditions.

Screwed onto base 24, by means of a pair of titanium screws 26 and flat washers 30, is spring 32. Spring 32 is in the shape of a generally elongated, angled bar, and is made of titanium (Ti). As is known, Ti has a resistivity on the order of 170 microohm-cm, which also has the effect of reducing eddy currents, particularly when compared with the resistivity of an alternate materials such as copper. (A copper alloy such as C10100 has a resistivity of 1.7 micro ohm-cm.) When assembled on base 24, spring 32 provides 10 lbs. of vertical force for a 6.35 mm deflection. In this manner, the design of spring 32 is optimized to provide the greatest possible force without yielding the spring, yet it allows deflection for loading masks using a minimal force. Also, those skilled in the art will recognize that the provision of 10 lbs. of force in the small physical "footprint" of clamp 14 overall is quite unique. Spring 32 is formed to have a protruding tab 34 in which is set lower ball 36. Although not easily seen in FIGS. 2A and B (but is shown in considerable detail in FIG. 3) lower ball 36 is not perfectly spherical, but rather is formed to be more like a half-sphere with a pin 40 on its under side. (Pin 40 is not visible in FIGS. 2A and B, but is visible in FIG. 3.) Tab 34 is designed so that it has a matingly configured hole 42 into which pin 40 can be inserted and glued, by means of a vacuum compatible epoxy, such as Torr-seal epoxy, so that lower ball 36 is fastened to tab 34. In the preferred embodiment, lower ball 36 is made of sapphire because sapphire provides an excellent coefficient of friction with the glass composition of the mask 12, making it harder for the mask 12 to slip during the rapid accelerations of mask 12 and clamp 14 during the laser scribing process. In the preferred embodiment, the sphere portion of lower ball 36 has a 3 mm diameter, which insures a good distribution of the clamping force, but is not so small as to cause excessive contact stresses on the glass.

Positioned above lower ball 36 is upper ball 44, which is likewise made of sapphire, and thereby has the same advantages discussed above in connection with lower ball 36. Upper ball 44 and lower ball 36 are directly opposed to one another such that when spring 32 is depressed, which thereby causes the downward movement of lower ball 36, mask 12 can be placed between upper ball 44 and lower ball 36. (Further details on the loading of mask 12 in clamp 14 are provided in connection with the discussion of FIGS. 5A–5C below.) Then, when spring 32 is released and it returns back towards its original position, upper ball 44 and lower ball 36 will pinch mask 12 in between themselves. In this manner, upper ball 44 and lower ball 36 are the components of clamp 14 which make physical contact with mask 12 for the purpose of holding it in place. It should be noted that spring 32 is fixed to base 24 using screws 26 and washers 30, and elastically deforms in a repeatable geometry. It should also be noted that upper ball 44 and lower ball 36 are perfectly aligned so that they are collinear, and thereby put compressive force on the opposing sides of mask 12.

Like lower ball 36, upper ball 44 also has the shape of a half-sphere with a pin 46. (Pin 46 of upper ball 44 is visible in FIG. 2B, but is also shown in detail in FIG. 3.) Pin 46 is inserted in a matingly configured hole 50 in brace 20, and is likewise glued into place using Torr-seal epoxy. Brace 20 is a generally rectangular component, tapered at the end which holds upper ball 44, and is made of molybdenum for purposes of rigidity. More specifically, brace 20 is designed to be able to accomodate a 10 pound force, and it provides virtually no deflection under that clamping force. Yet, it provides a small size and the clearances necessary to facilitate the loading of a mask.

As partially seen in FIG. 2B (and seen better in FIG. 3), the under side of brace 20 has channel 52 cut across it, wherein channel 52 has a semicircular cross section. Brace 20 further has a screw hole 54 disposed through it.

Positioned between brace 20 and base 24 is plate 56. Plate 56 is made of titanium, is generally rectangular, and has a number of screw holes 60 disposed through it, so that plate 56 can be fastened to base 24 by means of screws 62. Like brace 20, plate 56 has a channel 64 cut across it; however, in this instance, channel 64 has an angular cross section (best viewed in FIG. 3). As seen, disposed between brace 20 and plate 56 is pivot pin 66, which has a circular cross section (viewable in FIG. 3.) The channels of brace 20 and plate 56, on the one hand, and pivot pin 66, on the other hand, are matingly designed so that when these individual components of clamp 14 are assembled (as shown in FIGS. 2A and B), pivot pin 66 will be positioned in the respective channels 52 and 64 of brace 20 and plate 56. In this manner, brace 20 and plate 56, do not lie flatly against one another, but rather are separated by a gap, which is better shown and discussed below in connection with FIG. 3. In order to secure brace 20 to base 24 a retention screw 70 is used. When retention screw 70 is so secured through corresponding holes in brace 20 and plate 56, pivot pin 66 will also be secured in between these two components, in channels 52 and 64. Hole 54, which is disposed through brace 20, should be noted in particular because it has a rounded (concave) depression on the upper surface of brace 20. This rounded depression mates with the rounded, generally spherical underside of retention screw 70, and further details on the benefits of this mating relationship are discussed in connection with FIGS. 3 and 4.

Brace also contains a height adjustment screw 72 which is shown to be inserted in a hole 74 which is disposed through the back end of brace 20 at a 30° angle. For reasons that will be detailed in connection with FIGS. 3 and 4, the pitch of the thread of adjustment screw 72 is M3.5×0.35, which is comparatively very fine. Additionally, the tip of adjustment screw 72 has a domed or generally hemispherical shape.

When clamp 14 is fully assembled (as shown in FIG. 2A), disposed on either side of brace 20 are contacts 16a and 16b. Contacts 16a and 16b are mounted to base 24 by means of screws 76. Since base 24 is made of Macor (into which small pitch threads are difficult and expensive to machine as well as relatively weak in strength), inserted in matingly configured holes (not shown) in base 24 are threaded inserts 80, which are made of titanium. Thus, inserts 80 are epoxied to base 24 which thereby gives screws 76 a threaded hole to be screwed into. Contact 16a and 16b are virtually identical except for the fact that, in the preferred embodiment shown, contact 16a is connected to ground potential, and therefore may sometimes be referred to as "ground" contact 16a. When mask 12 is placed inside clamp 14, ground contact 16a will actually make electrical contact with mask 12 so that if any electrical current develops on the mask 12 it is bled off by means of ground contact 16a. On the other hand, contact 16b is, itself, electrically insulated by means of insulator washers 82. Like ground contact 16a, contact 16b will make electrical contact with mask 12 when it is secured in clamp 14. Contact 16b, however, is connected to an electrical test circuit (not shown) by means of wire 22 (shown in FIG. 1), and the electrical circuit is used to test to see whether mask 12 has been inserted in clamp 14. In other words, and especially when clamp 14 is used in a system which loads mask 12 into clamp 14 on carrier 10 under automated or robotic control, a test signal can be transmitted via contact 16b to determine if mask 12 has been loaded. If it has, then the system uses that response to signal that the automated system can move onto the next step, such as commencing the scribing operation on mask 12.

A suitable contact to perform the functions of contacts 16a and 16b are shown and discussed in detail in U.S. Pat. No. 5,843,623 to Pinckney, and the Pinckney patent is hereby incorporated by reference. Finally, in connection with the discussion of contacts 16a and 16b, it will be recalled that in connection with FIG. 1 it was mentioned that alternate embodiments of clamp 14 may or may not have any contacts at all (see, for example, clamps 14a and 14b, in FIG. 1). Thus, if one were to fashion an illustration of the preferred embodiment of clamp 14 without contacts, it would be easy enough to simply leave contacts 16a and 16b off of the illustrations. This would be particularly easy, since contacts 16a and 16b merely screw onto base 24 as described above.

At this point of the detailed description it is useful to note that each of the individual components comprising clamp 14 have been selected based upon their combined magnetic and electrical properties. As noted above, during a laser scribing process, such as one using an e-Beam lithography system, eddy currents can be generated in clamp 14. Because of the selection of the materials, based on their generally non-magnetic and high electrical resistivity properties, the eddy currents issue has been successfully addressed. Specifically, clamp 14 of the preferred embodiment was tested and determined to be "non-magnetic". For purposes of this detailed description, the term "non-magnetic" means that clamp 14 was tested using a magnetometer which was set to detect residual magnetism inside an envelope of 0.51 mm from the surface of clamp 14. When doing so, clamp 14 registered less than or equal to 0.01 milligauss, which would be generally recognized by those skilled in the art as being qualifying as "non-magnetic".

Figure 3:
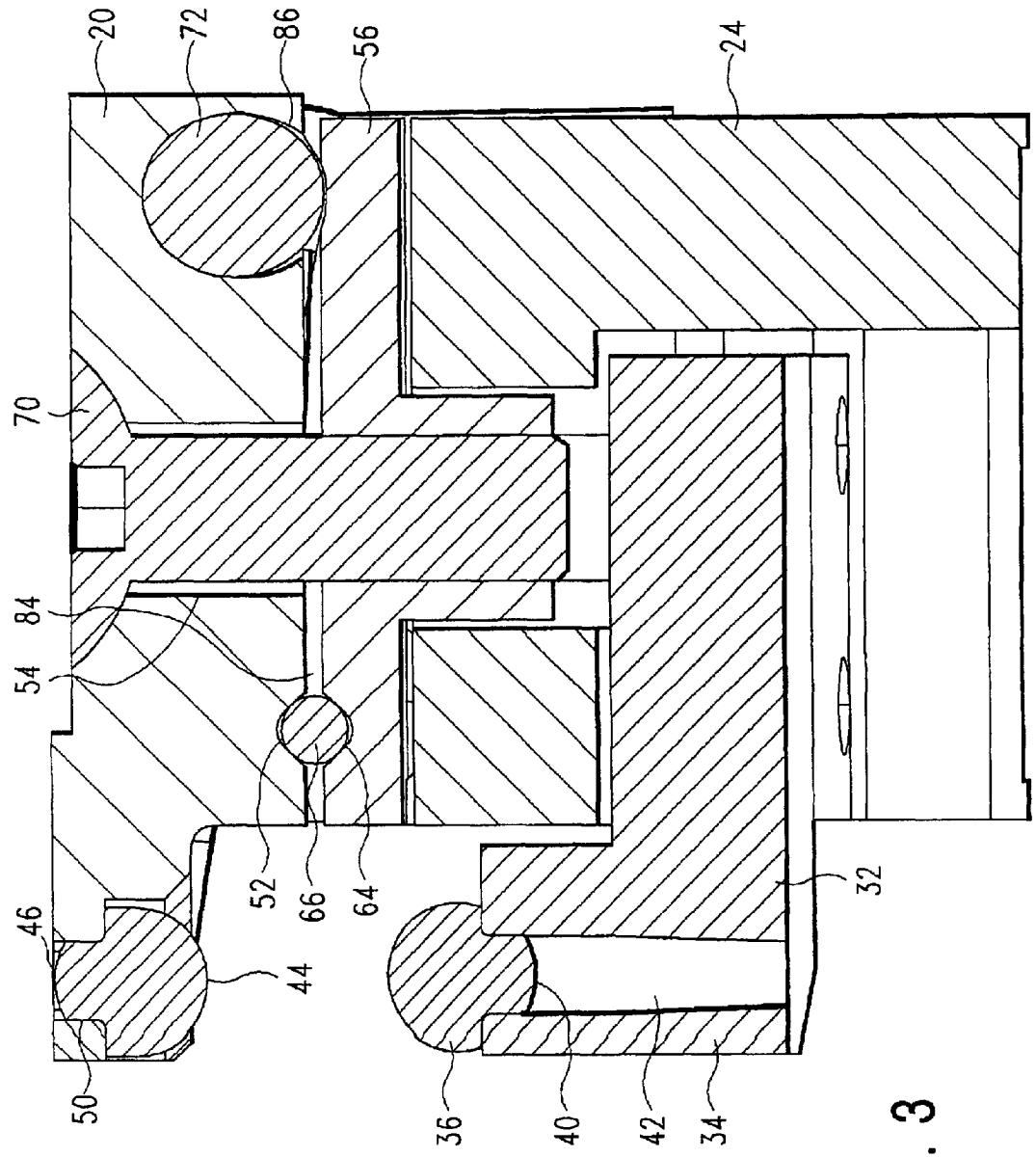
FIG. 3 is a side sectioned view of the clamp shown in FIG. 2A, as the same would appear if sectioned by the line 3—3 on FIG. 2A.

Turning now to FIG. 3, greater details are provided with respect to certain aspects of the preferred embodiment by providing a cross sectioned illustration. Referring just briefly back to FIG. 2A, however, it will be noticed that FIG. 2A has section line 3—3 which is intended to show the portion of clamp 14 that is revealed in the sectioned illustration of FIG. 3. From FIG. 3, some of the points discussed above can now be seen with greater clarity. For example, the actual shape of upper ball 44 and lower ball 36 can be seen, showing that they are not perfectly spherical, but rather are shaped like a hemisphere with a pin shaped on the ends that are used to secure them in either brace 20 or tab 34, respectively. Upper ball 44 and lower ball 36 are, however, formed of one integral unit of sapphire. Also, brace 20 is shown to be set on top of plate 56, however, as discussed, disposed between them, and inserted in channels 52 and 64, is pivot pin 66. As indicated above, it can now be seen that channel 64 actually has an angled cross section. Because pivot pin 66 is so disposed, it establishes a spaced gap 84 between brace 20 and plate 56 to enable height adjustment of the mask. For securing purposes, retention screw 70 passes through brace 20, and effectively holds brace 20 in place, but also thereby secures pivot pin 66 because it is lodged between brace 20 and plate 56. Focusing on retention screw 70 and its corresponding hole 54 in brace 20, it can be seen that hole 54 is slightly oversized relative to the dimension of retention screw 70 such that, although brace 20 is secured by retention screw 70, it is still afforded a range of motion. Additionally, that range of motion is further enabled by the fact that hole 54 has a concave shape which is matingly adapted for the convex (rounded) bottom side of the head of retention screw 70. Finally, one other additional detail that is observable in FIG. 3 is the intersection of the hemispherical tip 86 of adjustment screw 72 with the top portion of plate 56. (To avoid confusion, it should be noted that the actual threads of retention screw 70 and adjustment screw 72 have not been shown in any of the figures for ease of illustration and for clarity of the drawings.)

Figure 4:
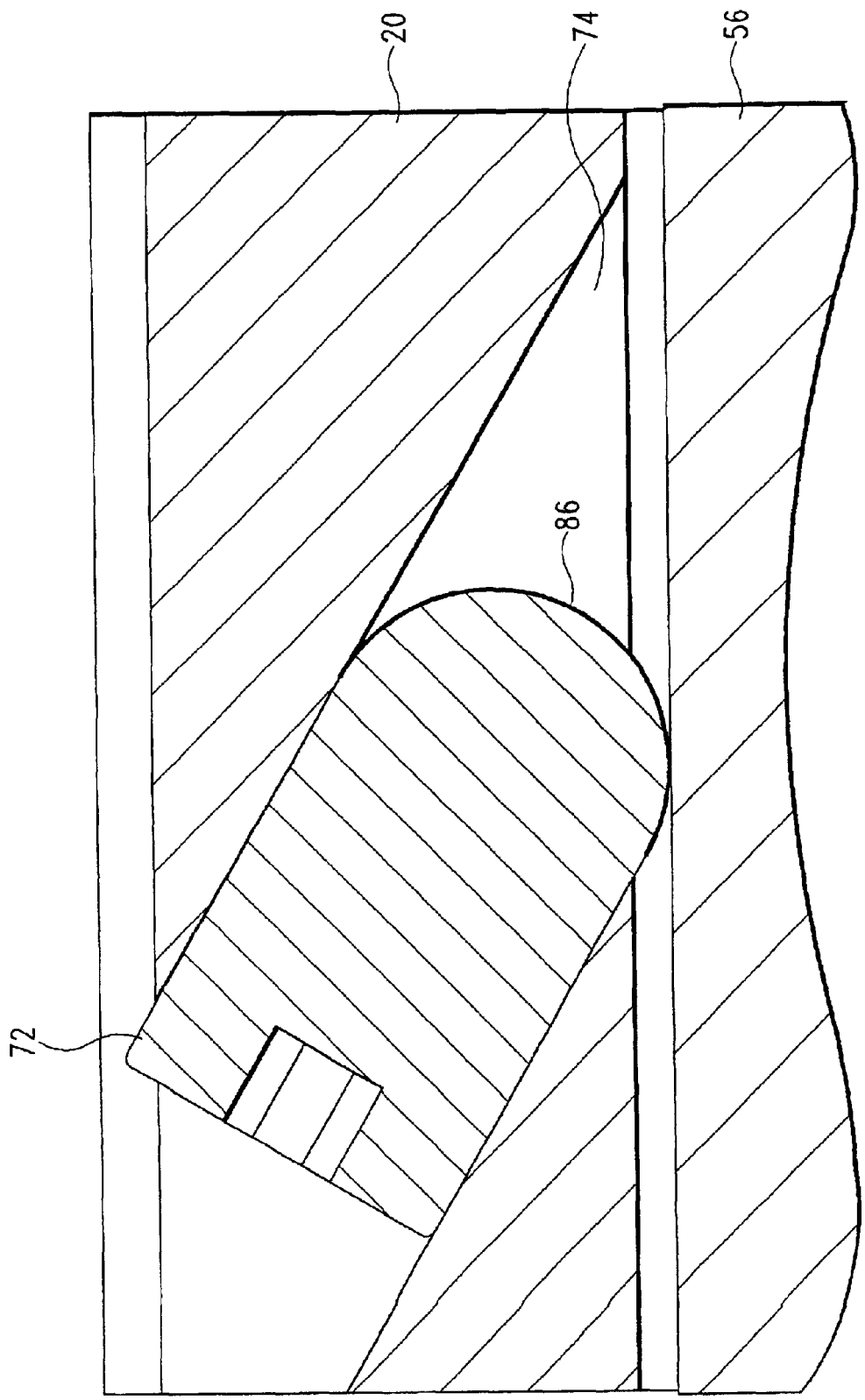
FIG. 4 is a side sectioned view of the clamp shown in FIG. 2A, as the same would appear if sectioned by the line 4—4 on FIG. 2A.

Referring now to FIG. 4, yet further details are provided with respect to adjustment screw 72 by likewise providing a cross sectioned illustration. Again, referring briefly back to FIG. 2A, there is a section line 4—4 which is intended to illustrate the portion of clamp 14 that is revealed in FIG. 4. In FIG. 4, it can be seen that adjustment screw 72 is set at an angle relative to the planes formed by brace 20 and plate 56, and in the preferred embodiment, that angle is 30°. When adjustment screw 72 is screwed in hole 74 in brace 20 it will eventually make physical contact with the top side of plate 56. As seen in detail in FIG. 4, the part of adjustment screw 72 which makes the contact is its hemispherical tip 86.

Recalling the high level illustrations of clamp 14 (in FIGS. 2A and 2B), and looking more specifically at FIGS. 3 and 4, it can now be appreciated why certain of these components are designed in their particular way. Specifically, adjustment screw 72 affords a means by which the height of brace 20, and therefore upper ball 44, can be adjusted. Keeping in mind that brace 20 and plate 56 are separated by pivot pin 66, and also keeping in mind the range of motion afforded brace 20 because of the size of hole 54 as well as the rounded underside of retention screw 70 sitting in concave hole 54, brace 20 will actually move up and down as a result of the movement of adjustment screw 72. For example if adjustment screw 72 is screwed deep inside hole 74, thereby causing the back end of brace 20 to rise, it will cause the front end of brace 20 to drop, which correspondingly causes upper ball 44 to move in the direction of lower ball 36. As can be seen from FIG. 3, pivot pin 66 provides the actual fulcrum about which the plane formed by brace 20 will pivot depending upon the movement of adjustment screw 72.

It should be noted that because adjustment screw 72 has such a fine threading, it allows 1 micron of vertical displacement of the upper ball 44 for a turn of approximately 2° of adjustment screw 72. Additionally, the installation of adjustment screw 72 at an angle of 30° effectively doubles the resolution of the already fine pitch thread of adjustment screw 72. Also, the domed (hemispherical) shape of the tip 86 of adjustment screw 72 ensures that there is always an accurate contact point between adjustment screw 72 and plate 56. All of these features enable the highly accurate and refined adjustments of the height of upper ball 44, which, in turn, is necessary to adjust the height of mask 12 for purposes of establishing a planar surface prior to processing with the scribing tool. Also, because retention screw 70 has a rounded underside, which mates with the concave shape of hole 54, the spherical contact surface provides a net vertical force such that the precise vertical locking force of retention screw 70 is independent of the angle of brace 20 due to the position of adjustment screw 72. It will be known to those skilled in the art that if a conventional flat screw and chamfer had been used, there would only be line contact, not a net vertical force, and such a flat screw might become mechanically unstable under the 10 lb. clamping loads repeatably applied.

Figure 5A:
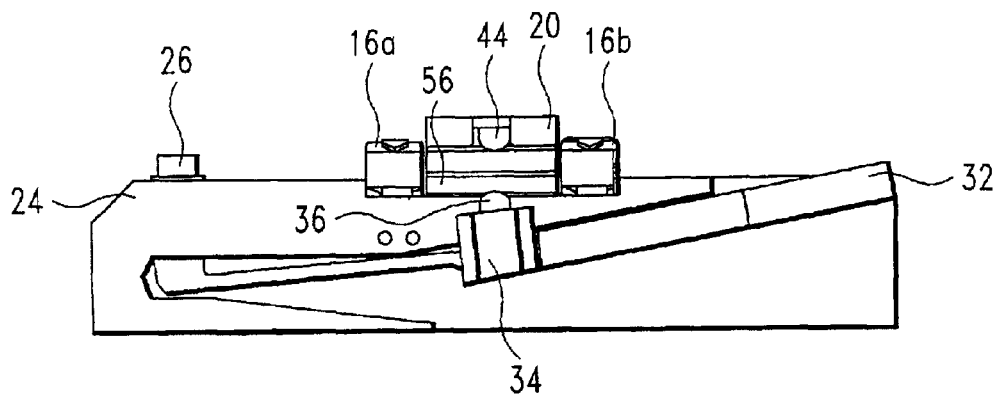
FIGS. 5A–5C are a sequence of drawings of a side view of the clamp of FIG. 2A showing the way in which the spring of the clamp can be deflected downward in anticipation of the loading of a semiconductor mask, and then the spring is released so that the mask is clamped in place.
Figure 5B:
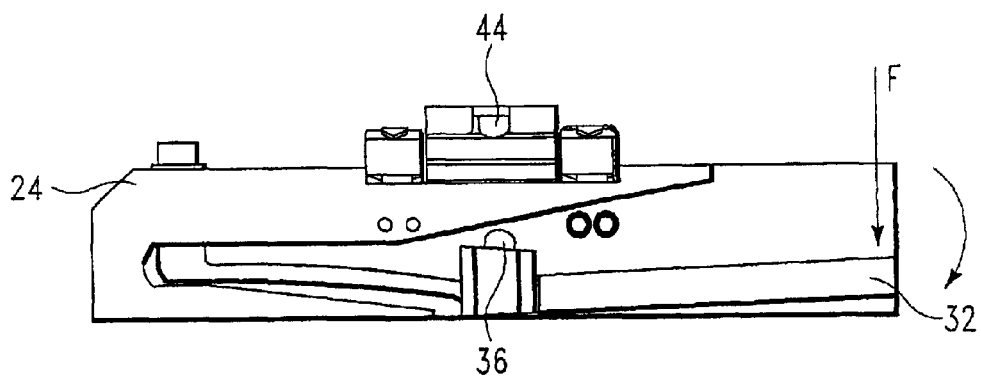
Figure 5C:
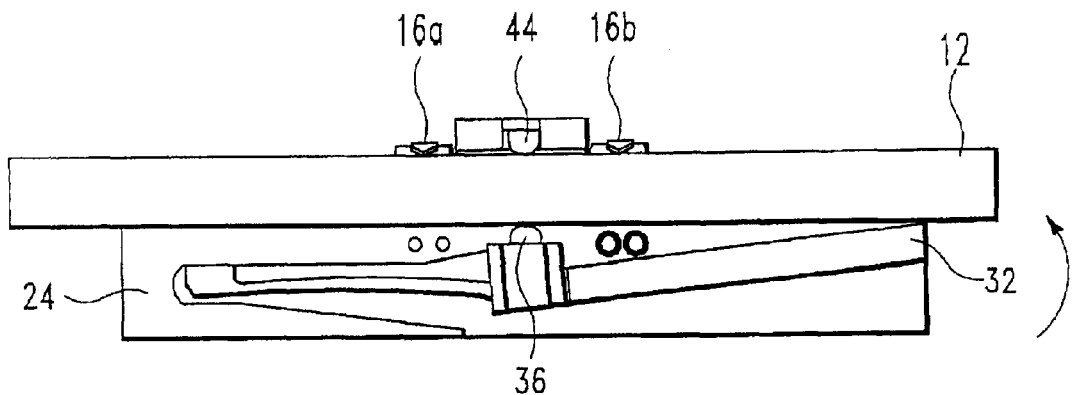

Reference is now made to FIGS. 5A–5C, which are a sequence of drawings showing the way in which clamp 14 can be loaded with a mask 12. In addition to referring to FIGS. 5A–5C, it will also be helpful to concurrently refer to FIG. 6, which provides a flow diagram illustrating the steps by which clamp 14 is so loaded. FIG. 5A shows a side view of the preferred embodiment of clamp 14. As shown in FIG. 5A, clamp is essentially "at rest", meaning that it is waiting to be loaded with a mask 12. FIG. 5A also shows the major component parts of clamp 14, namely base 24, spring 32, brace 20 upper ball 44, plate 56, lower ball 36, and contacts 16a and 16b (which, as discussed above, are optional).

To commence the process, reference is now made to FIG. 5B at which point a force (F) has been applied to spring 32 to cause it to be deflected downward so that lower ball 36 is separated further from upper ball 44 (FIG. 6, step 100). In the design of the preferred embodiment, it has been found that a force (F) of approximately 7.5 lbs., when applied at the end of spring 32 that is opposite to where spring 32 is attached by screws 26 to base 24 (as shown in FIG. 5B), is sufficient to depress spring 32 enough to allow a 6.35 mm thick mask 12 to be loaded. In other words, the design of spring 32 provides the mechanical advantage of being able to apply a force (F) of only 7.5 lbs. at a point (as shown in FIG. 5B) which is at the end of spring 32 opposite to the end where it is attached to base 24, and yet the clamping force between lower ball 36 and upper ball 44 will be 10 lbs. Thus, by reducing the amount of force needed to open spring 32 wide enough to accommodate mask 12, clamp 14 is designed to ensure that carrier 10 will not be damaged when three of these clamps are activated simultaneously, as they could be when used in the configuration shown in FIG. 1.

Also, it should be noted that in accordance with this description, in order to so separate lower ball 36 and upper ball 44, the force can be applied from the top down, which facilitates the automated or robotic loading of clamp 14.

Next, either manually or automatically, mask 12 is placed in clamp 14 by positioning mask 12 between the separated lower ball 36 and upper ball 44 (FIG. 6, step 102). After mask 12 is so placed, the force on spring 32 is gradually released so that mask 12 is engaged by the compressive contact of upper ball 44 from the top and lower ball 36 from below (FIG. 6, step 104). FIG. 5C shows this final illustration in the sequence, wherein the force (F) on spring 32 is taken away so that spring 32 deflects back toward its original position, and mask 12 is secured between upper ball 44 and lower ball 36. It should be noted that not only will upper ball 44 and lower ball 36 make physical contact with mask 12, but also contacts 16a and 16b will make electrical contact with mask 12 (FIG. 6, step 106). Through that electrical contact, mask 12 can be tested by an electrical test signal to ensure that it is in place (a feature which is especially helpful when mask 12 is automatically or robotically loaded in clamp 14), and also an electrical contact can be used to maintain mask 12 at a given electrical potential, such as ground, while it is being processed (FIG. 6, step 110). Finally, with mask 12 so positioned, if it is necessary, such as for purposes of planarizing the top surface of mask 12 relative to the orientation of the laser or E-beam that will etch the pattern on the surface of mask 12, adjustment screw 72 can be turned to adjust the height of upper ball 44, which will thereby have the affect of adjusting the top surface of mask 12 (FIG. 6, step 112).

It will be appreciated by those skilled in the art that the apparatus and method of the present invention is not limited to the preferred embodiments discussed above. In particular it will be known by those skilled in the art that modifications can be made without departing from the spirit of the invention. For example, alternate materials could be used, as well as specific components could be reshaped and resized to be adapted to specific applications. Accordingly, any such modifications are considered within the scope of the invention, and such invention is limited solely by the appended claims.

What is claimed is:

1. An apparatus for clamping an article which is to be processed on a moving carrier device, the apparatus comprising:
    a non-magnetic base having an upper surface;
    a first contact portion having a first surface for making compressive contact with said article, said first contact portion being affixed to said base;
    a generally elongated, non-magnetic spring extending along said base and angled with respect to said upper surface, said spring having a first end and a second end, the first end being attached to said base, said spring having affixed thereto a second contact portion having a second surface for making compressive contact with said article, said second surface being opposed to said first surface, wherein said spring can be deflected at the second end in a direction normal to said upper surface in order to place said article between said first and second surfaces and said spring can then be released to cause said first and second contact portions to compressively clamp said article; and
    an adjustment screw disposed at an angle to said upper surface, for adjusting a vertical displacement of the first contact portion relative to the base.

2. The apparatus of claim 1, wherein said adjustment screw is effective to adjust the vertical displacement of the first contact portion relative to the base to within about 1 micron.

3. The apparatus of claim 1, wherein said base is of a high resistivity material.

4. The apparatus of claim 1, wherein said first contact portion and said second contact portion are of sapphire.

5. The apparatus of claim 1, wherein said first and second surfaces establish a compressive force on said article of at least 10 lbs.

6. An apparatus for clamping a semiconductor mask, said mask being generally planar such that it has two comparatively large and opposing sides, said apparatus comprising:
    a base having an upper surface and including an adjustable brace;
    a first contact means for making compressive contact with one of said mask sides, said first contact means being affixed to said brace;
    a generally elongated spring extending along said base and angled with respect to said upper surface, said spring having first and second ends, said spring being attached to said base at said first end of said spring, said spring being actuated by deflecting said second end in a direction normal to said upper surface, said spring also having a second contact means for making compressive contact with the other of said mask sides, said second contact means being positioned between said first and second ends of said spring and such that said first and second contact means are opposed to one another; and
    an adjustment screw disposed in a hole in said brace at an angle to said upper surface, for adjusting a vertical displacement of said first contact means relative to the base.

7. The apparatus of claim 6, wherein said adjustment screw is effective to adjust the vertical displacement of said first contact means to within about 1 micron.

8. The apparatus of claim 6, wherein said adjustment screw has a domed shaped tip.

9. The apparatus of claim 6, wherein said first and second contact means are of a material selected in accordance with a material composition of said mask, such that there is a high coefficient of friction between said first and second contact means and said mask.

10. The apparatus of claim 9, wherein said first contact means and said second contact means are of sapphire.

11. The apparatus of claim 9, wherein the portion of said first and second contact means, respectively, which comes in direct contact with said mask is generally domed shaped.

12. The apparatus of claim 6, wherein said base, said brace, said spring, and said first and second contact means are made of non-magnetic materials.

13. The apparatus of claim 6, wherein said brace has a channel cut in it, and said apparatus further comprises a pivot pin that is matingly adapted for insertion in said channel, said brace and said pin being mounted such that adjustments to said adjustment screw will cause said brace to pivot on said pin.

14. The apparatus of claim 13, wherein said brace has a hole with a concave surface cut in it, and said apparatus further comprises a retention screw, including a screw head having a convex surface on its underside, said screw head being configured such that when said retention screw is inserted in said hole said convex surface of said screw head will matingly engage said concave surface of said hole.

15. The apparatus of claim 6, further comprising an electrical contact for making electrical connection with said mask when said mask is clamped in said apparatus.

16. An apparatus for clamping a semiconductor mask, said mask being generally planar such that it has two comparatively large and opposing side, said apparatus comprising:

a base having an adjustable brace, said brace having a channel and a hole with a concave surface, said brace being adjustable by means of an adjustment screw;

a first contact means for making compressive contact with one of said mask sides, said first contact means being affixed to said brace;

a generally elongated spring having first and second ends, said spring being attached to said base at said first end of said spring, said spring also having a second contact means for making compressive contact with the other of said mask sides, said second contact means being positioned such that it is between said first and second ends of said spring and such that said first and second contact means are opposed to one another;

a pivot pin that is matingly adapted for insertion in said channel, said brace and said pin being mounted such that adjustments to said adjustment screw will cause said brace to pivot on said pin;

a retention screw, including a screw head having a convex surface on its underside, said screw head being configured such that when said retention screw is inserted in said hole said convex surface of said screw head will matingly engage said concave surface of said hole.

17. The apparatus of claim 16, wherein said adjustment screw has a domed shaped tip.

18. The apparatus of claim 16, wherein said first and second contact means are of a material selected in accordance with a material composition of said mask, such that there is a high coefficient of friction between said first and second contact means and said mask.

19. The apparatus of claim 18, wherein said first and second contact means are of sapphire.

20. The apparatus of claim 18, wherein the portion of said first and second contact means, respectively, which comes in direct contact with said mask is generally domed shaped.

21. The apparatus of claim 16, wherein said base, said brace, said spring, and said first and second contact means are made of non-magnetic materials.

22. The apparatus of claim 16, further comprising an electrical contact for ranking electrical connection with said mask when said mask is clamped in said apparatus.

* * * * *